(12) United States Patent
Nakata et al.

(10) Patent No.: US 9,653,390 B2
(45) Date of Patent: May 16, 2017

(54) SEMICONDUCTOR DEVICE AND SEMICONDUCTOR DEVICE MANUFACTURING METHOD

(75) Inventors: Yosuke Nakata, Tokyo (JP); Masayoshi Tarutani, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 0 days.

(21) Appl. No.: 14/422,573

(22) PCT Filed: Sep. 4, 2012

(86) PCT No.: PCT/JP2012/072476
§ 371 (c)(1),
(2), (4) Date: Feb. 19, 2015

(87) PCT Pub. No.: WO2014/037996
PCT Pub. Date: Mar. 13, 2014

(65) Prior Publication Data
US 2015/0235925 A1  Aug. 20, 2015

(51) Int. Cl.
*H01L 23/48* (2006.01)
*H01L 23/498* (2006.01)
*H01L 23/00* (2006.01)

(52) U.S. Cl.
CPC ............ *H01L 23/498* (2013.01); *H01L 24/03* (2013.01); *H01L 24/08* (2013.01); *H01L 24/11* (2013.01); *H01L 24/16* (2013.01); *H01L 2224/034* (2013.01); *H01L 2224/0401* (2013.01); *H01L 2224/05083* (2013.01);
(Continued)

(58) Field of Classification Search
CPC ........ H01L 23/498; H01L 24/03; H01L 24/08; H01L 24/16; H01L 24/11; H01L 2924/13055; H01L 2924/01013; H01L 2224/05124; H01L 2224/05083; H01L 2224/16245; H01L 2224/16113
See application file for complete search history.

(56) References Cited

U.S. PATENT DOCUMENTS 5,656,863 A     8/1997  Yasunaga et al.
5,891,756 A *   4/1999  Erickson ............... H01L 24/11
                                                    257/E21.508

(Continued)

FOREIGN PATENT DOCUMENTS

CN    102810523 A    12/2012
DE    19750073 A1     5/1999
(Continued)

OTHER PUBLICATIONS

International Search Report; PCT/JP2012/072476; Dec. 11, 2012.
(Continued)

*Primary Examiner* — Ahmed Sefer
(74) *Attorney, Agent, or Firm* — Studebaker & Brackett PC

(57) ABSTRACT

A semiconductor device of the present invention includes a semiconductor element, a surface electrode formed on a surface of the semiconductor element, a metal film formed on the surface electrode so as to have a joining portion and a stress relieving portion formed so as to border on and surround the joining portion, solder joined to the joining portion while avoiding the stress relieving portion, and an external electrode joined to the joining portion through the solder.

13 Claims, 13 Drawing Sheets

(52) U.S. Cl.
CPC ............... *H01L 2224/05124* (2013.01); *H01L 2224/16113* (2013.01); *H01L 2224/16245* (2013.01); *H01L 2924/01022* (2013.01); *H01L 2924/01028* (2013.01); *H01L 2924/01042* (2013.01); *H01L 2924/01047* (2013.01); *H01L 2924/01079* (2013.01); *H01L 2924/07025* (2013.01); *H01L 2924/13055* (2013.01); *H01L 2924/2064* (2013.01); *H01L 2924/2065* (2013.01); *H01L 2924/20641* (2013.01); *H01L 2924/20642* (2013.01); *H01L 2924/20643* (2013.01); *H01L 2924/20644* (2013.01); *H01L 2924/20645* (2013.01); *H01L 2924/20646* (2013.01); *H01L 2924/20647* (2013.01); *H01L 2924/20648* (2013.01); *H01L 2924/20649* (2013.01)

(56) References Cited

U.S. PATENT DOCUMENTS

| | | | |
|---|---|---|---|
| 6,125,043 | A | 9/2000 | Hauer et al. |
| 6,191,493 | B1 * | 2/2001 | Yasunaga .............. H01L 21/565 257/773 |
| 2007/0138624 | A1 * | 6/2007 | Sudo .................. H01L 23/3121 257/706 |
| 2010/0089979 | A1 * | 4/2010 | Irslinger .................. B23K 1/19 228/176 |
| 2011/0312134 | A1 * | 12/2011 | Machida ............. H01L 21/4842 438/123 |
| 2012/0306079 | A1 | 12/2012 | Nakano et al. |

FOREIGN PATENT DOCUMENTS

| | | | |
|---|---|---|---|
| JP | H06-302604 A | | 10/1994 |
| JP | H11-284180 A | | 10/1999 |
| JP | 2006-049427 A | | 2/2006 |
| JP | 2007-173272 A | | 7/2007 |
| JP | 2008-182074 A | | 8/2008 |
| JP | 2008-244045 A | | 10/2008 |
| JP | 2012-54294 | * | 3/2012 |
| WO | 2009/151108 A1 | | 12/2009 |

OTHER PUBLICATIONS

Notification of Transmittal of Translation of the International Preliminary Report on Patentability and Translation of Written Opinion of the International Searching Authority; PCT/JP2012/072476; issued on Mar. 19, 2015.

An Office Action issued by the Korean Patent Office on Dec. 1, 2015, which corresponds to Korean Patent Application No. 10-2015-7005393 and is related to U.S. Appl. No. 14/422,573; with English language partial translation.

An Office Action; "Result of Reexamination," issued by the Korean Patent Office on Jun. 8, 2016, which corresponds to Korean Patent Application No. 10-2015-7005393 and is related to U.S. Appl. No. 14/422,573; with English language translation.

An Office Action; "Notice of Reason for Rejection," issued by the Japanese Patent Office on Feb. 9, 2016, which corresponds to Japanese Patent Application No. 2014-534065 and is related to U.S. Appl. No. 14/422,573; with English language partial translation.

Office Action dated Jan. 27, 2016 with English Translation, issued in corresponding German Application.

Office Action dated Jan. 27, 2016 with Partial English Translation, issued in corresponding German Application No. 11 2012 006 875.0.

A First Office Action issued by the Chinese Patent Office on Sep. 28, 2016, which corresponds to Chinese Patent Application No. 201280075614.5 and is related to U.S. Appl. No. 14/422,573; with English language translation.

An Office Action; "Notice of Reasons for Rejection," issued by the Japanese Patent Office on Sep. 27, 2016, which corresponds to Japanese Patent Application No. 2014-534065 and is related to U.S. Patent Application No. 14/422,573; with partial English language translation.

* cited by examiner

SEMICONDUCTOR DEVICE AND SEMICONDUCTOR DEVICE MANUFACTURING METHOD

TECHNICAL FIELD

The present invention relates to a semiconductor device used for, for example, switching of large current and to a method of manufacturing the semiconductor device.

BACKGROUND ART

Patent Literature 1 discloses a semiconductor device in which an external electrode which is a copper plate and a semiconductor element electrode are directly joined to each other through solder. The external electrode and the semiconductor element electrode are directly joined through solder for the purpose of realizing wiring connection capable of large-current energization while having reduced electrical resistance.

Patent Literature 2 discloses forming a metal film (plating electrode) on a portion of a semiconductor element electrode (emitter electrode), the metal film having good connection to solder. This metal film is joined to a heat sink through solder. Concentration of stress in a peripheral end portion of the metal film is prevented by controlling the distance and the relative position between the metal film and the heat sink.

PRIOR ART

Patent Literature

Patent Literature 1: Japanese Patent Laid-Open No. 2008-182074

Patent Literature 2: Japanese Patent Laid-Open No. 2008-244045

SUMMARY OF INVENTION

Technical Problem

In a semiconductor device having a semiconductor element, a portion through which a current for the semiconductor element flows receives thermal stress due to a temperature cycle. There is a problem that if solder and a semiconductor element electrode contact each other under such a thermal stress environment as in the semiconductor device in Patent Literature 1, thermal stress is produced due to the difference in linear expansion coefficient between the solder and the semiconductor element electrode to cause cracks in the semiconductor element electrode.

The technique disclosed in Patent Literature 2 has a problem that productivity is low because of a need to accurately control the distance and the relative position between the metal film and the heat sink.

The present invention has been achieved to solve the above-described problems, and an object of the present invention is to provide a semiconductor device that can inhibit the occurrence of cracks in an electrode caused by stress from solder by a simple method, and a method of manufacturing the semiconductor device.

Means for Solving the Problems

A semiconductor device according to the present invention includes a semiconductor element, a surface electrode formed on a surface of the semiconductor element, a metal film formed on the surface electrode so as to have a joining portion and a stress relieving portion formed so as to border on and surround the joining portion, solder joined to the joining portion while avoiding the stress relieving portion, and an external electrode joined to the joining portion through the solder.

A method of manufacturing the semiconductor device according to the present invention includes a step of forming a surface electrode on a semiconductor element, a step of forming a metal film on the surface electrode, and a joining step of forming solder on a central portion of the metal film while avoiding a peripheral portion of the metal film, and joining the metal film to an external electrode through the solder.

Other features of the present invention will be made clear below.

Advantageous Effects of Invention

According to the present invention, the stress relieving portion disperses stress from the solder, thus enabling inhibition of the occurrence of a crack in the electrode.

DESCRIPTION OF EMBODIMENTS

A semiconductor device and a semiconductor device manufacturing method according to an embodiment of the present invention will be described with reference to the drawings. Identical or corresponding constituent elements are indicated by the same reference symbols and are not repeatedly described in some cases.

Embodiment 1

Figure 1:
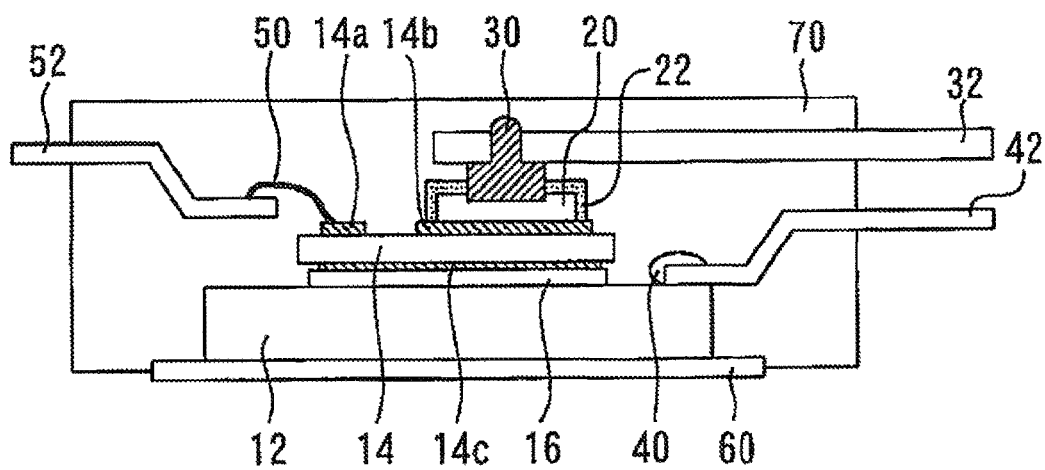
FIG. 1 is a cross-sectional view of a semiconductor device according to Embodiment 1 of the present invention.

FIG. 1 is a cross-sectional view of a semiconductor device according to Embodiment 1 of the present invention. A semiconductor device 10 includes a base plate 12 formed of a metal. A semiconductor element 14 formed of a vertical IGBT is disposed above the base plate 12. A gate electrode 14a and an emitter electrode (hereinafter "surface electrode 14b") are formed on an upper surface of the semiconductor element 14. A collector electrode 14c is formed on a lower surface of the semiconductor element 14. The gate electrode 14a and the surface electrode 14b are formed of a material having an aluminum content of 95% or more. The collector electrode 14c is formed of a multilayer metal film for securing a good connection to solder. The multilayer metal film forming the collector electrode 14c is constituted of Ti/Ni/Au, AlSi/Ti/Ni/Au, or the like in order from the semiconductor element 14 side. The collector electrode 14c is fixed to the base plate 12 by solder 16.

A metal film 20 is formed on the surface electrode 14b. The metal film 20 is covered with a coating film 22, with a portion of the upper surface of the metal film 20 exposed. Solder 30 formed of SnAgCu-based Pb-free solder is joined to the portion of the metal film 20 exposed out of the coating film 22. The solder 30 joins an external electrode 32 extending to the outside of the semiconductor device 10 to the metal film 20.

An external electrode 42 is joined to the base plate 12 by solder 40. A wire 50 is connected to the gate electrode 14a. The wire 50 connects an external electrode 52 extending to the outside to the gate electrode 14a. An insulating sheet 60 is adhered to a lower surface of the base plate 12. The above-described components are each covered with an encapsulation material 70 exposing the external electrodes 32, 42, and 52 and the lower surface of the insulating sheet 60 to the outside.

Figure 2:
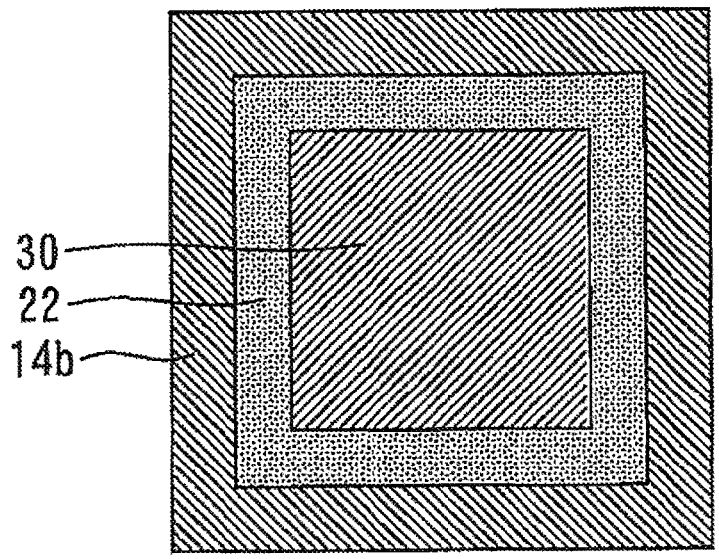
FIG. 2 is a plan view of the surface electrode, the coating film and the solder.
Figure 3:
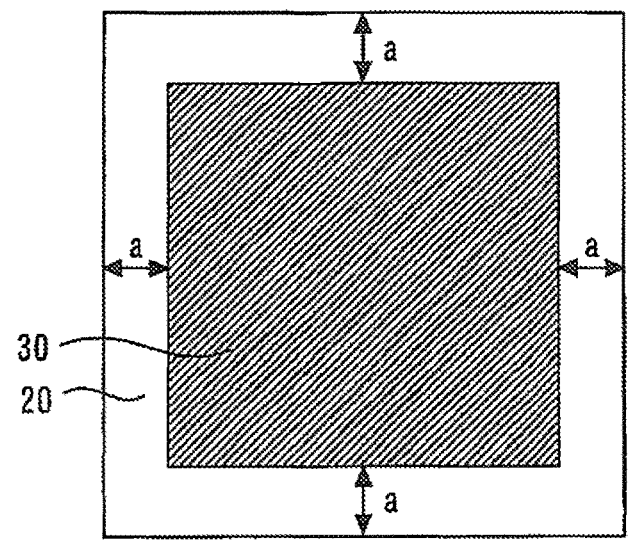
FIG. 3 is a plan view of the metal film and the solder.

FIG. 2 is a plan view of the surface electrode, the coating film and the solder. The solder 30 is surrounded by the coating film 22. FIG. 3 is a plan view of the metal film and the solder. The solder 30 is formed only on a central portion of the metal film 20. Accordingly, no part of the solder 30 is formed in a peripheral portion of the metal film 20.

Figure 4:
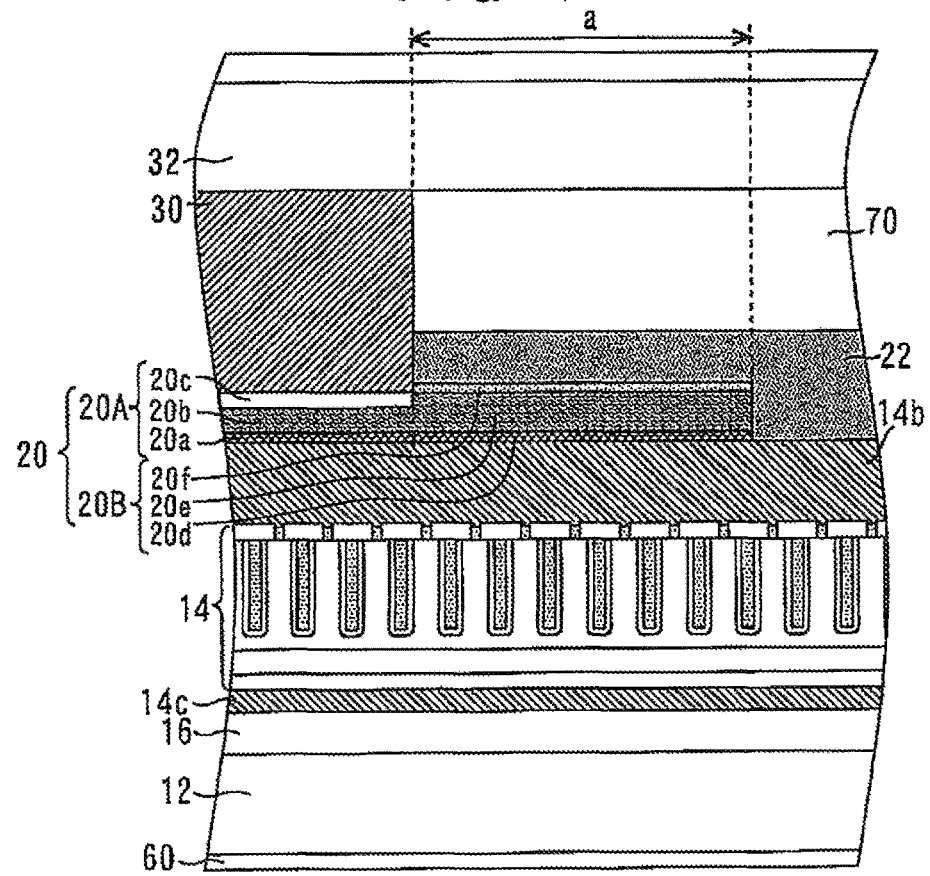
FIG. 4 is an enlarged view of the peripheral portion of the metal film and members surrounding the peripheral portion.

FIG. 4 is an enlarged view of the peripheral portion of the metal film and members surrounding the peripheral portion. The metal film 20 has a joining portion 20A and a stress relieving portion 20B formed so as to border on and surround the joining portion 20A. The stress relieving portion 20B is the peripheral portion of the metal film 20 shown in FIG. 3. The joining portion 20A will first be described with reference to FIG. 4. The joining portion 20A has a first intimate-contact film 20a formed of Ti or Mo on the surface electrode 14b. The joining portion 20A has a first joining film 20b formed of Ni on the first intimate-contact film 20a. Further, the joining portion 20A has an alloy portion 20c formed of solder and Ni on the first joining film 20b.

The stress relieving portion 20B will subsequently be described. The stress relieving portion 20B has a second intimate-contact film 20d formed of Ti or Mo on the surface electrode 14b. The stress relieving portion 20B has a second joining film 20e formed of Ni on the second intimate-contact film 20d. Further, the stress relieving portion 20B has an antioxidation film 20f formed of Au or Ag on the second joining film 20e. The first joining film 20b is formed thinner than the second joining film 20e. Preferably, the thickness of the first joining film 20b is set to a value equal to or larger than 0.5 μm. The stress relieving portion 20B is formed so that a length (length a) from a portion bordering on the joining portion 20A to an outermost peripheral portion is equal to or larger than 10 μm.

The solder 30 is jointed to the upper surface of the joining portion 20A. The external electrode 32 is joined to the joining portion 20A through the solder 30. The solder 30 is joined to the joining portion 20A while avoiding the stress relieving portion 20B. The coating film 22 covering the stress relieving portion 20B is formed so that the solder 30 does not contact the stress relieving portion 20B. Preferably, the coating film 22 may be formed of a polyimide film having a thickness within the range from 2 to 20 μm.

Figure 5:
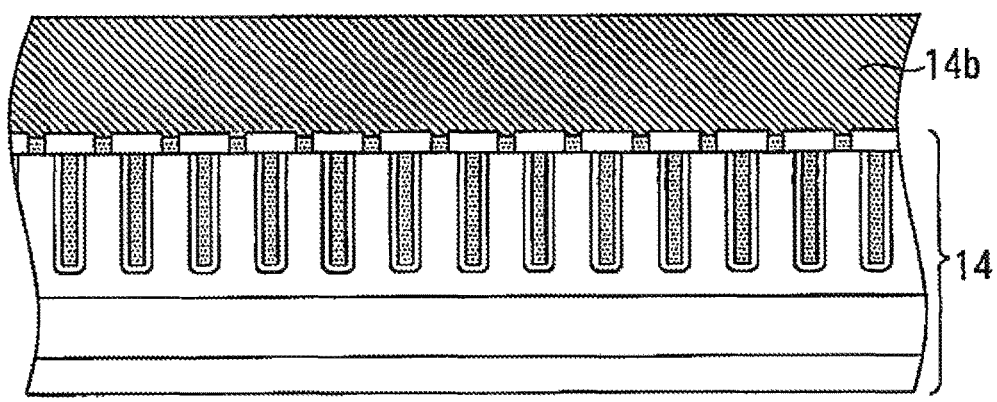
FIG. 5 is a cross-sectional view showing a state after forming the surface electrode on the semiconductor element.

The semiconductor device manufacturing method according to Embodiment 1 of the present invention will subsequently be described. First, the surface electrode 14b is formed on the semiconductor element. FIG. 5 is a cross-sectional view showing a state after forming the surface electrode on the semiconductor element. The surface electrode 14b is formed by, for example, Al, AlSi or AlCu by sputtering. The surface electrode 14b is thereafter heated at 400 to 470° C. in a hydrogen or nitrogen atmosphere. By this heat treatment, the crystal size of the surface electrode 14b is increased and the flatness of the surface electrode 14b is improved. The coverage of the surface electrode 14b with the metal film 20 can thus be improved.

Figure 6:
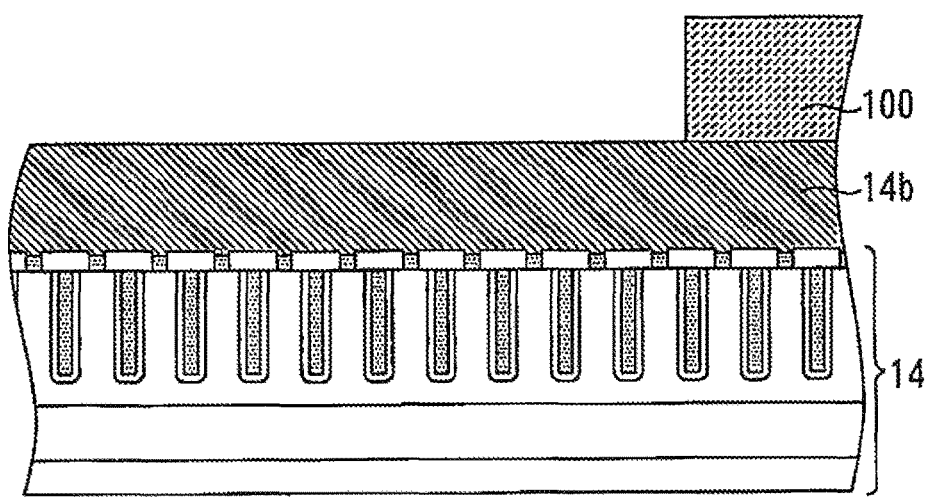
FIG. 6 is a cross-sectional view showing a state after forming a resist on a portion of the surface electrode.

Next, a resist is formed on a portion of the surface electrode 14b. FIG. 6 is a cross-sectional view showing a state after forming a resist on a portion of the surface electrode. A resist 100 is formed, for example, by lithography so as to cover a region of the surface electrode 14b where formation of metal film should be avoided.

Figure 7:
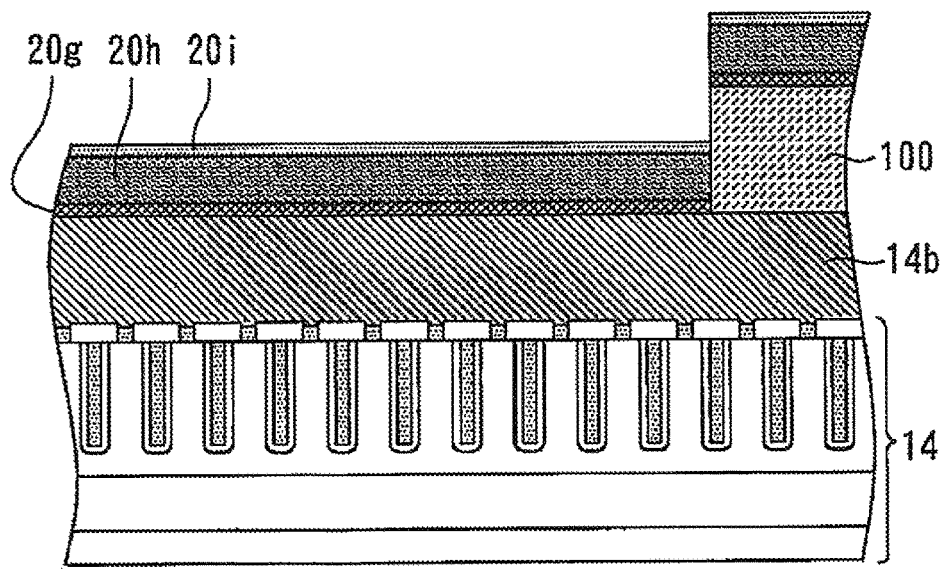
FIG. 7 is a cross-sectional view showing a state after forming the metal film.

Next, metal film is formed on the surface electrode 14b and the resist 100. FIG. 7 is a cross-sectional view showing a state after forming the metal film. The metal film has, in order from the surface electrode 14b side, an intimate-contact film 20g formed of Ti or Mo, a joining film 20h formed of Ni on the intimate-contact film 20g, and an antioxidation film 20i formed of Au or Ag on the joining film 20h. The intimate-contact film 20g, the joining film 20h and the antioxidation film 20i are formed, for example, by sputtering.

In the intimate-contact film 20g, the joining film 20h and the antioxidation film 20i, the joining film 20h that forms a suitable chemical compound film with the solder to function as a barrier against excessive corrosion caused by the solder is largest in thickness. The joining film 20h (the first joining film 20b and the second joining film 20e of the semiconductor device 10) substantially determines the mechanical strength of the metal film 20.

The antioxidation film 20i is formed for the purpose of limiting the reduction in solder wettability of the joining film 20h when the joining film 20h formed of Ni is oxidized. Incidentally, the portion in contact with the resist 100 of the metal film formed on the surface electrode 14b may include a microscopic structural mixture or have a film thickness deviating from the desired value; it is a portion relatively lower in strength.

Figure 8:
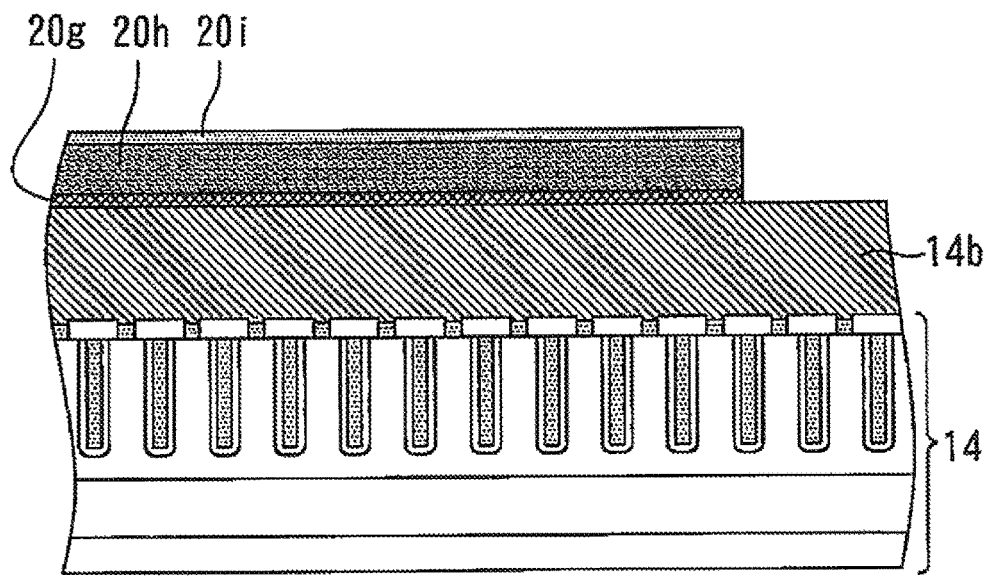
FIG. 8 is a cross-sectional view showing a state after removal of the resist.

Next, the resist 100 is removed. FIG. 8 is a cross-sectional view showing a state after removal of the resist. In this process step, the resist 100 is immersed in a chemical liquid for removal of the resist, thereby removing the resist 100 and the metal film on the resist 100. The metal film is thus formed in the desired region on the surface electrode 14b.

Figure 9:
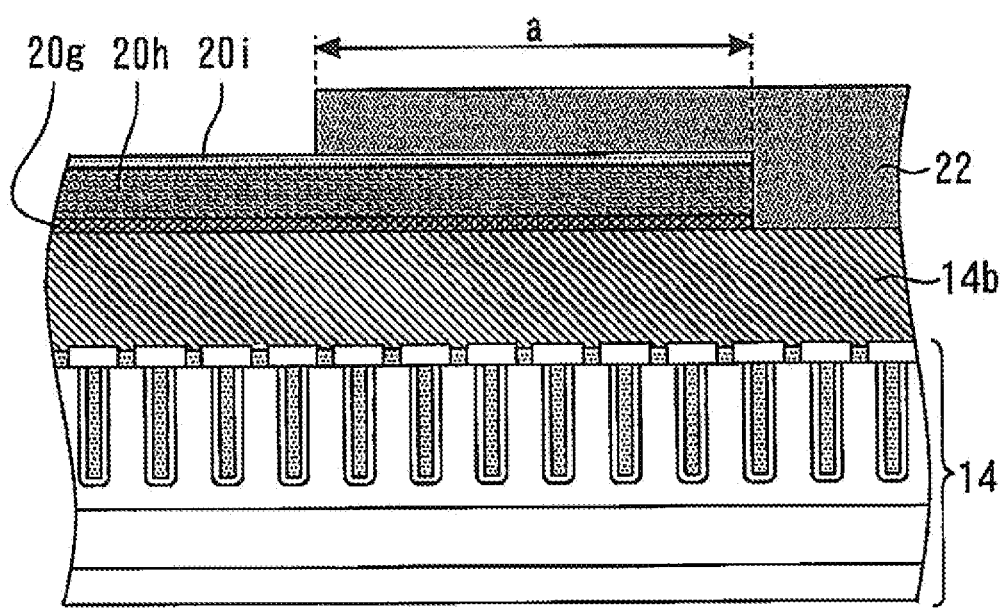
FIG. 9 is a cross-sectional view showing a state where the peripheral portion of the metal film is covered with the coating film.

Next, a peripheral portion of the metal film is covered with the coating film 22. The peripheral portion is a portion that becomes the stress relieving portion afterward. FIG. 9 is a cross-sectional view showing a state where the peripheral portion of the metal film is covered with the coating film. The coating film 22 is formed by lithography using photosensitive polyimide. A combination of non-photosensitive polyimide and a photosensitive resist may alternatively be used. In such a case, a photosensitive resist is worked into a desired shape by lithography and non-photosensitive polyimide is thereafter worked. The coating film 22 is formed to have a film thickness of about 2 to 20 μm.

Figure 10:
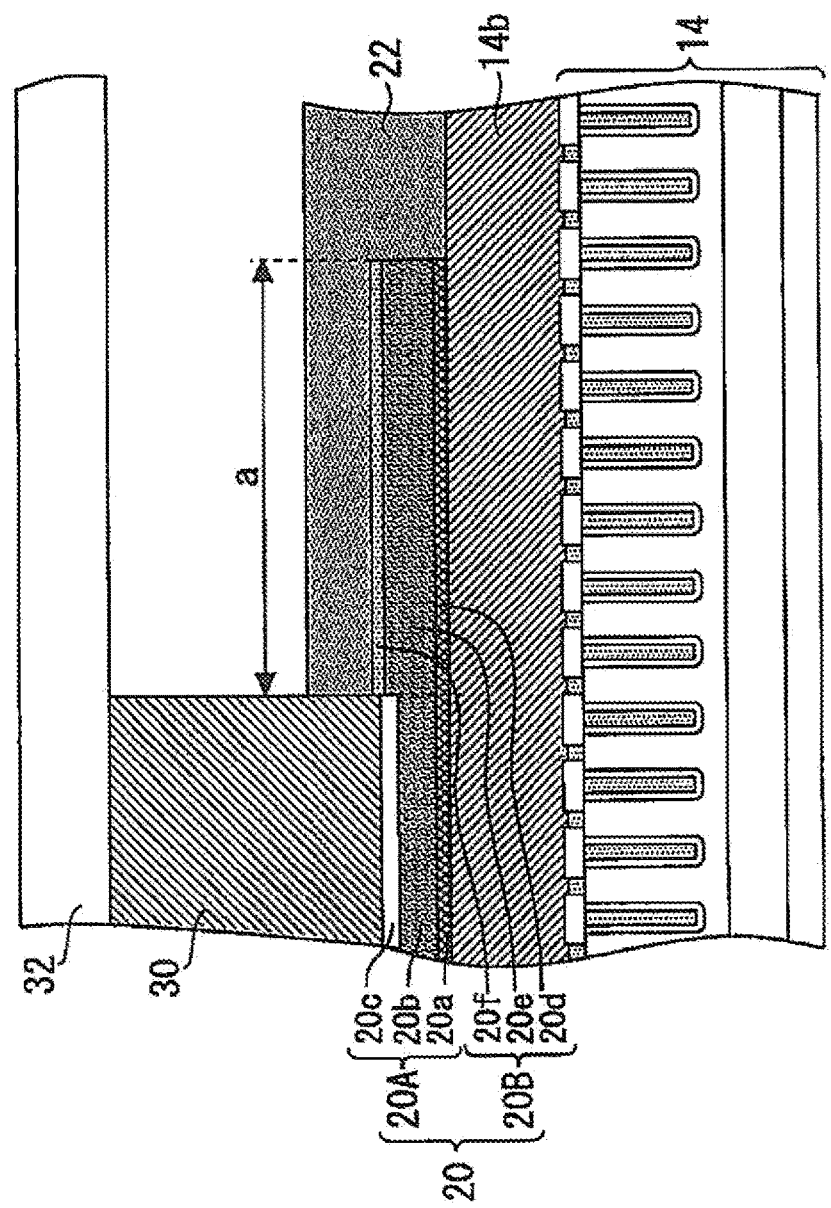
FIG. 10 is a cross-sectional view showing a state after soldering of the external electrode to the joining portion in the joining step.

Next, a joining step is executed. FIG. 10 is a cross-sectional view showing a state after soldering of the external electrode to the joining portion in the joining step. In the joining step, the external electrode 32 and the joining portion 20A are jointed together through the solder 30, for example, by dropping molten solder to the joining portion 20A from a through hole provided in the external electrode 32. At this time, since the coating film 22 is formed on the peripheral portion of the metal film 20, the solder is formed on the central portion of the metal film 20 by avoiding forming on the peripheral portion. That is, the coating film 22 prevents wet-spreading of the solder. The portion of the metal film 20 on which the solder is formed becomes the joining portion 20A while the portion that is covered with the coating film 22 and on which the solder is not formed becomes the stress relieving portion 20B.

When dropping of the solder is started, the antioxidation film 20i in the central portion of the metal film 20 diffuses immediately into the solder. Thereafter, Ni in the joining film 20h in the central portion of the metal film 20 and the solder react in alloying reaction with each other to form the solder-Ni alloy portion 20c. The film thickness of the joining film 20h in the central portion of the metal film 20 is reduced only by a value corresponding to the alloy portion 20c (e.g., about 0.3 μm). The portion thus reduced in film thickness is the first joining film 20b. As a method of solder-joining the external electrode 32 and the metal film, a method other than the method using molten solder, e.g., a method of melting plate solder with a formic acid atmosphere may be adopted. After the above-described process steps, the semiconductor device 10 shown in FIG. 1 is completed.

Figure 11:
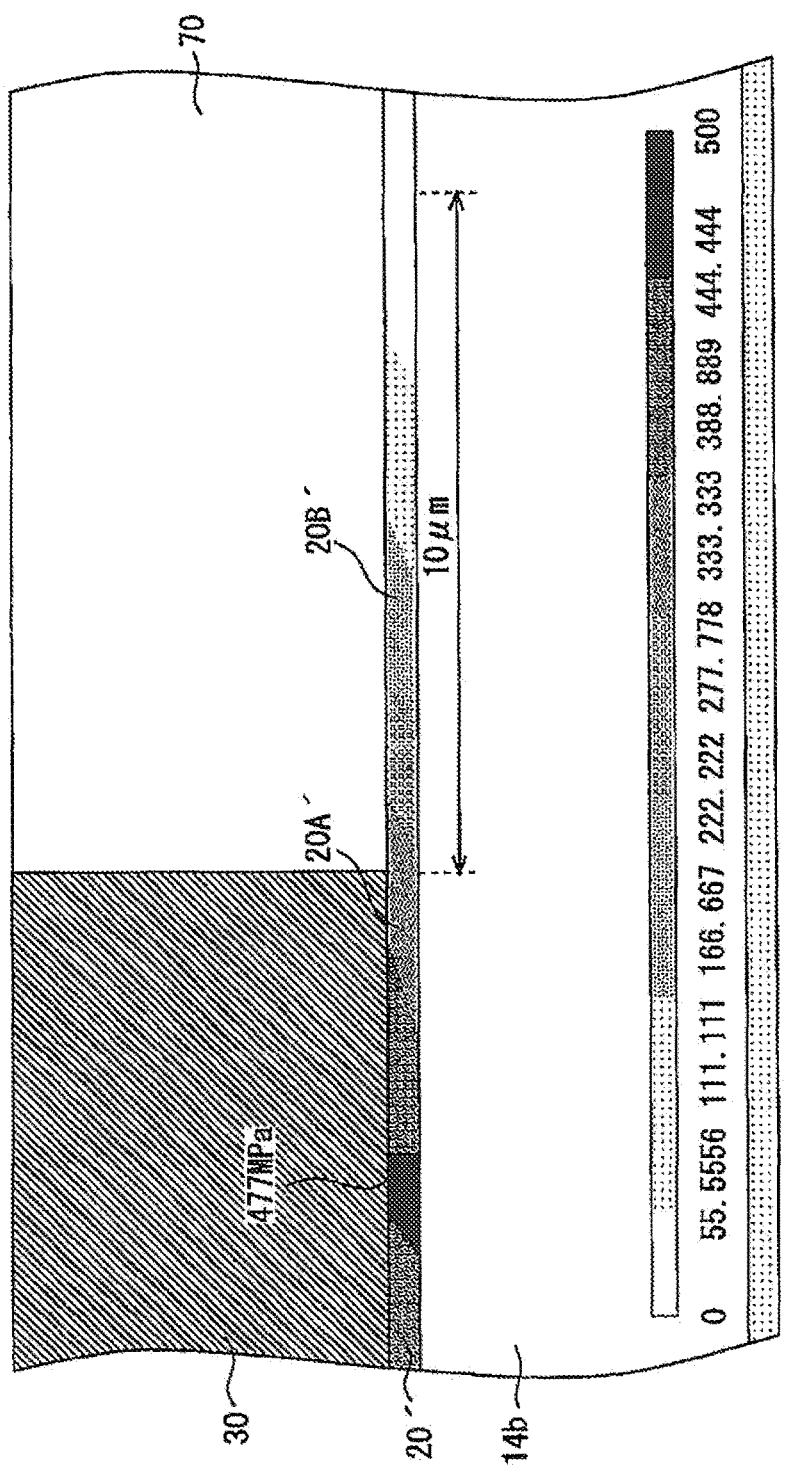
FIG. 11 is a diagram showing a stress distribution in the metal film when the film thickness of the metal film is 0.5 μm.
Figure 12:
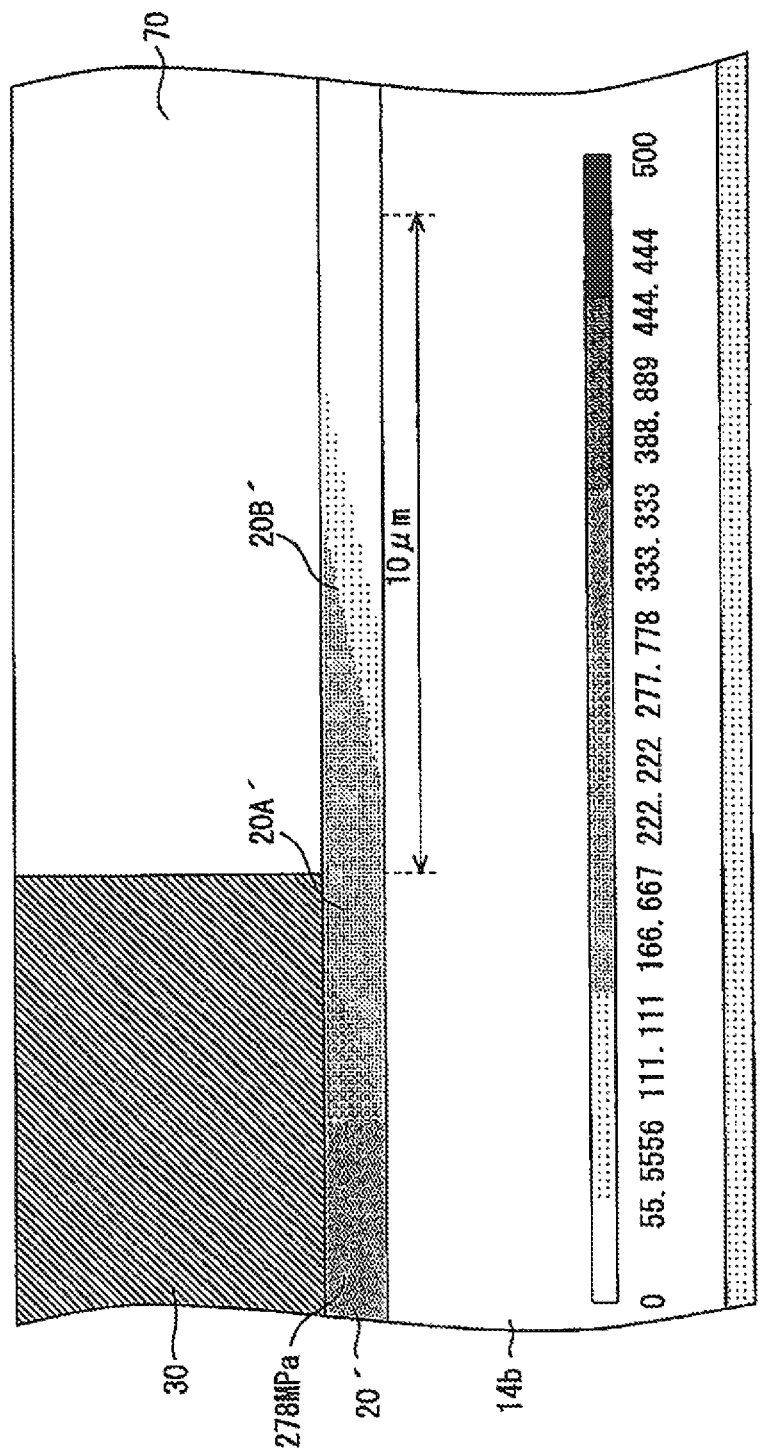
FIG. 12 is a diagram showing a stress distribution in the metal film when the film thickness of the metal film is 1.0 μm.
Figure 13:
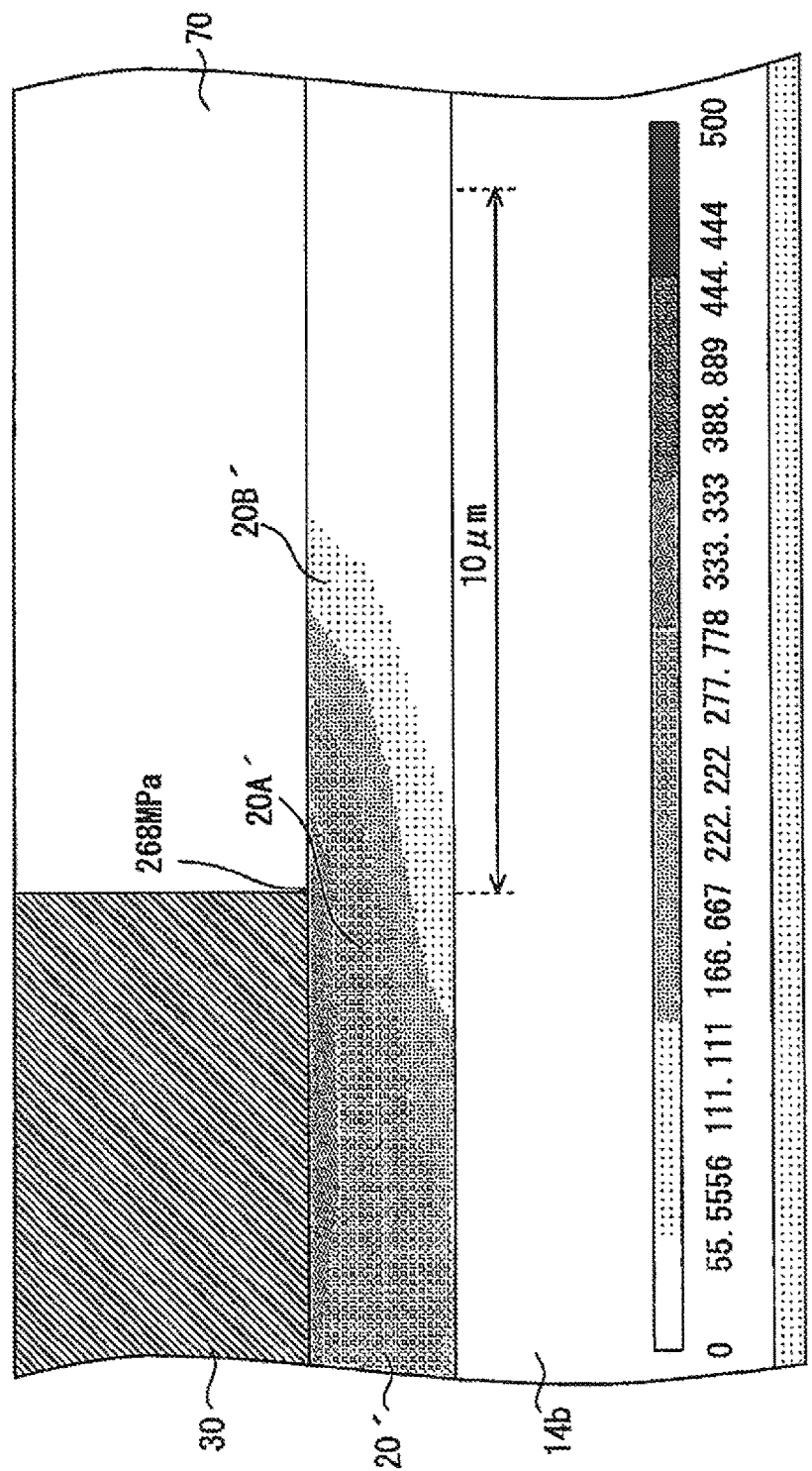
FIG. 13 is a diagram showing a stress distribution in the metal film when the film thickness of the metal film is 2.0 μm.

There is a possibility of occurrence of high stress in the solder due to the semiconductor element heating/cooling cycle. FIGS. 11 to 13 each shows results of analysis of a stress distribution in the metal film when the solder was heated to 125° C. Mainly the joining film in the metal film sustains stress from the solder. Therefore, an analysis model was constructed by forming metal film 20' only of Ni, which is the material of the joining film. Also, the stress relieving portion is covered with the encapsulation material 70.

FIG. 11 is a diagram showing a stress distribution in the metal film when the film thickness of the metal film is 0.5 μm. FIG. 12 is a diagram showing a stress distribution in the metal film when the film thickness of the metal film is 1.0 μm. FIG. 13 is a diagram showing a stress distribution in the metal film when the film thickness of the metal film is 2.0 μm. From these analysis results, it can be understood that while mainly stress in a joining portion 20A' in the metal film is higher, high stress is also produced in a stress relieving portion 20B' from the end of the solder 30 to an outer position at a distance of about 10 μm therefrom. In the semiconductor device according to Embodiment 1 of the present invention, the stress relieving portion 20B is formed so that the length (a) from the portion bordering on the joining portion 20A to the outermost peripheral portion is equal to or larger than 10 μm and, therefore, stress produced in the metal film 20 is dispersed in the stress relieving portion 20B. Thus, stress influencing the surface electrode 14b can be reduced by sufficiently relieving the stress from the solder with the stress relieving portion 20B.

As apparent from FIGS. 11 to 13, the joining portion 20A' is burdened with high stress in comparison with the stress relieving portion 20B'. It is, therefore, necessary that the strength of the metal film be uniform and high in the joining portion 20A'. However, the outermost peripheral portion of the metal film may include a microscopic structural mixture or have a film thickness deviating from the desired value, and it is a portion relatively lower in strength, as described above. Embodiment 1 of the present invention is therefore arranged so that while the joining portion 20A in which the strength of the metal film 20 is higher is mainly burdened with stress, the stress relieving portion 20B in which the strength of the metal film is lower performs an assistive stress-relieving function, thereby obtaining an improved stress-relieving effect. This arrangement enables inhibition of deformation of the metal film 20 and buckling and separation of the surface electrode 14b caused by stress from the solder 30 and, hence, inhibition of growth of a crack in the surface electrode 14b.

Preferably, the length (a) of the stress relieving portion 20B from the portion bordering on the joining portion 20A to the outermost peripheral portion is set to a value in the range from 50 to 500 μm, if possible. Setting the length (a) to a value equal to or larger than 50 μm ensures that a certain margin can be secured with respect to the controllability of the positions and pattern of the coating film 22 and the metal film 20, and that a pattern abnormality can be detected by a simple inspection. Also, setting the length (a) to a value equal to or smaller than 500 μm ensures intimate contact between the antioxidation film 20f and the coating film 22 and, hence, prevention of the coating film 22 from separating from the metal film 20 in the wafer process including the joining step. Thus, increasing the length a is useful in sufficiently relieving stress with the stress relieving portion even when the operating temperature of the semiconductor element is increased and when the region of the stress relieving portion in which stress is high is increased.

Figure 14:
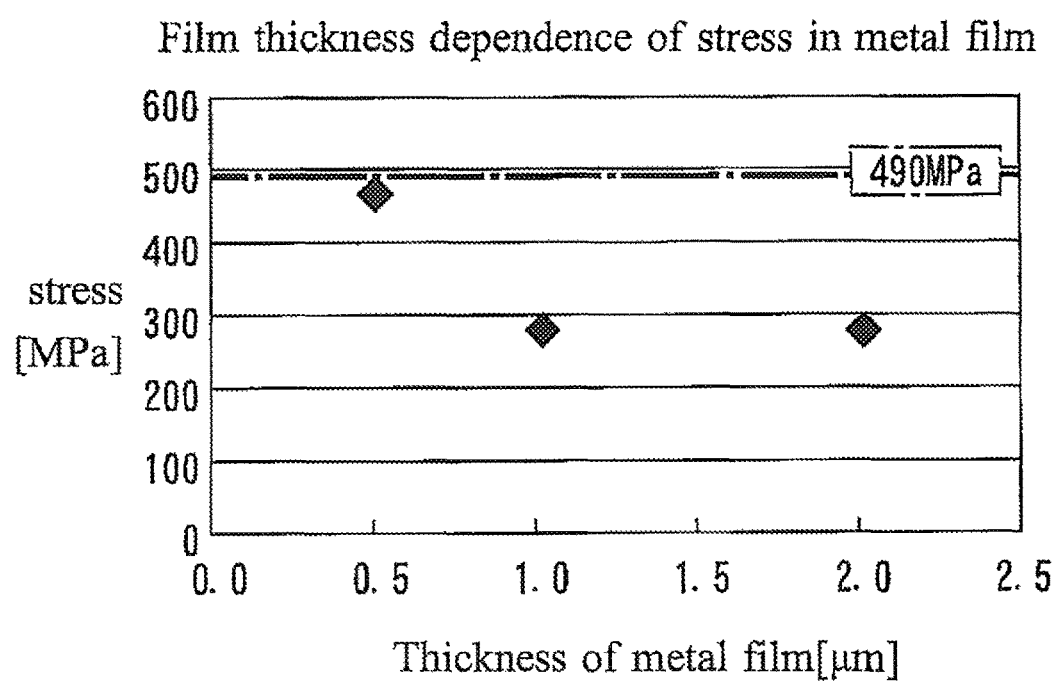
FIG. 14 is a graph showing the relationship between the thickness of the metal film and stress produced in the metal film.

FIG. 14 is a graph showing the relationship between the thickness of the metal film and stress produced in the metal film. In a case where the metal film is formed by ordinary sputtering using Ni, the yield stress of the metal film is 490 MPa. It is, therefore, necessary that stress in the metal film be not higher than 490 MPa. It can be understood from FIG. 14 that stress produced in the metal film when the thickness of the metal film is equal to or larger than 0.5 μm is lower than 490 MPa. Thus, when the thickness of the metal film is set to a value equal to or larger than 0.5 μm, stress produced in the metal film is lower than the yield stress of the metal film and the metal film can therefore sustain the stress from the solder without being deformed by the stress from the solder. In Embodiment 1 of the present invention, the thickness of the first joining film 20b is set to a value equal to or larger than 0.5 μm and inhibition of deformation of the metal film 20 can thereby be achieved.

It can be understood from FIG. 14 that the stress reduction effect is saturated when the thickness of the metal film exceeds 1 μm. Also, it is difficult to work the shape by depositing Ni to 3 μm or more by sputtering in an ordinary semiconductor process. There is, therefore, a need to set the thickness of the metal film to a suitable value by considering securing of the mechanical strength and securing of ease of manufacturing. Alloying reaction causes a reduction of about 0.3 μm in the thickness of the first joining film 20b in the joining portion 20A. It is, therefore, desirable to set the thickness of the joining film 20h formed by sputtering to a value equal to or larger than 0.8 μm in order that the first joining film 20b after the joining step can be equal to or larger than 0.5 μm. In a case where the joining film 20h is formed, for example, of Ni—P by electroless plating, however, an optimum film thickness is differently determined by making the same consideration as that described above.

In the semiconductor device manufacturing method according to Embodiment 1 of the present invention, the joining step is executed after forming the coating film 22 with which the stress relieving portion 20B is covered and, therefore, wet-spreading of solder is stopped by the coating film 22 to enable the solder 30 to be formed "only on the central portion of the metal film 20". Use of polyimide having high resistance to heat for the coating film 22 enables avoidance of an influence on the process after the joining step. It is preferable to set the thickness of the coating film 22 to a value in the range from 2 to 20 μm in order to inhibit wet-spreading of molten solder.

The surface electrode 14b according to Embodiment 1 of the present invention has an aluminum content of 95% or more, can therefore be easily formed and worked into an electrode for a semiconductor element using any of various semiconductor substrates including Si substrates, and is capable of bonding with improved joining characteristics when metal wires are connected thereto. Since Ti or Mo is used for the first intimate-contact film 20a and the second intimate-contact film 20d, it is possible to prevent diffusion of Ni of the first joining film 20b and the second joining film 20e to the surface electrode 14b side while securing intimate contact between the surface electrode 14b and the metal film 20.

It is generally difficult to join SnAgCu-based Pb-free solder to the surface electrode 14b having an aluminum content of 95% or more. However, in the semiconductor device according to Embodiment 1 of the present invention, the solder 30 is joined to the metal film 20 and, therefore, good junction and solder wettability can be secured between the solder 30 and the metal film 20.

The present invention is not limited to the surface electrode 14b provided as the emitter electrode in Embodiment 1 of the present invention. Inhibition of a crack in a surface electrode formed on a surface of the semiconductor element 14 can be achieved by forming the above-described metal film 20 and the coating film 22 on the surface electrode. Therefore, the surface electrode is not limited to a particular type as long as the electrode is formed on the semiconductor element 14. The semiconductor element 14 is not limited to the IGBT. The semiconductor element 14 may be, for example, a MOSFET or a diode. The metal film 20 is not limited to the three-layer structure. For example, Ni—P formed by plating growth can be used as metal film 20. These modifications can also be applied to a semiconductor device and a semiconductor device manufacturing method according to an embodiment described below.

Embodiment 2

Figure 15:
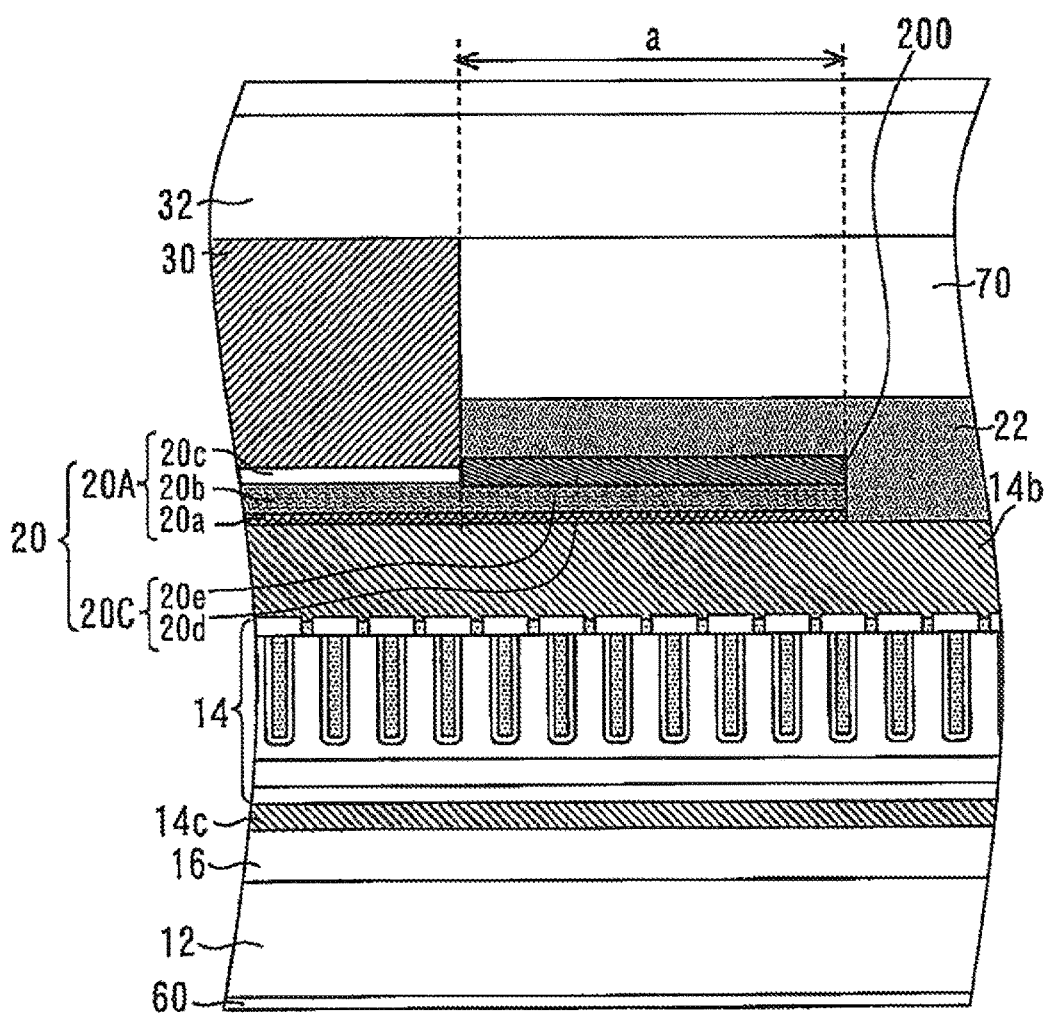
FIG. 15 is a cross-sectional view of a peripheral portion of a metal film and members surrounding the peripheral portion in the semiconductor device according to Embodiment 2 of the present invention.

A semiconductor device and a semiconductor device manufacturing method according to Embodiment 2 of the present invention correspond in many respects to those according to Embodiment 1 and will therefore be described mainly with respect to points of difference from Embodiment 1. FIG. 15 is a cross-sectional view of a peripheral portion of a metal film and members surrounding the peripheral portion in the semiconductor device according to Embodiment 2 of the present invention. A feature of the semiconductor device according to Embodiment 2 of the present invention resides in that a modified film 200 is formed on a surface of a stress relieving portion 20C.

The modified film 200 is formed of a material less solderable than the surface portion of the joining portion 20A so as to prevent the solder 30 from wet-spreading into a region right above the stress relieving portion 20C. More specifically, the modified film 200 is formed of a metal oxide film obtained by oxidizing Ni. The modified film 200 has a length (a) equal to or larger than 10 μm from the portion bordering on the joining portion 20A to the outermost peripheral portion. The length (a) of the stress relieving portion 20C from the portion bordering on the joining portion 20A to the outermost peripheral portion is also equal to or larger than 10 μm. It is preferable that the length indicated by "a" in FIG. 15 be a value in the range from 100 to 1000 μm.

Figure 16:
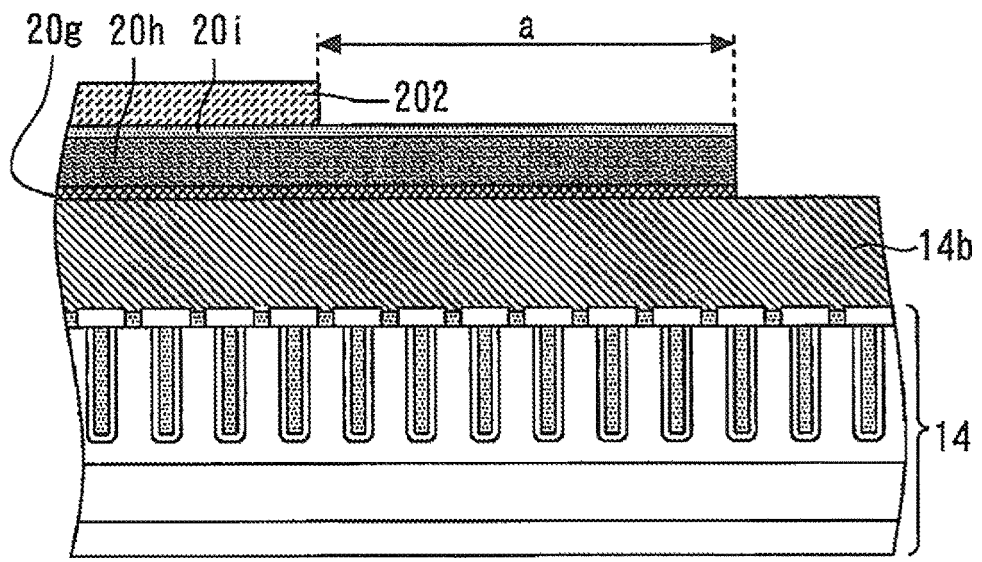
FIG. 16 is a cross-sectional view showing a state after forming the sacrificial protective film on the metal film.

The semiconductor device manufacturing method according to Embodiment 2 of the present invention will be described. After the metal film 20 is formed, a sacrificial protective film is formed. FIG. 16 is a cross-sectional view showing a state after forming the sacrificial protective film on the metal film. A sacrificial protective film 202 is formed only on the central portion of the metal film 20 and is not on the peripheral portion of the metal film. The sacrificial protective film 202 can be formed, for example, by using a photosensitive resist and lithography.

Figure 17:
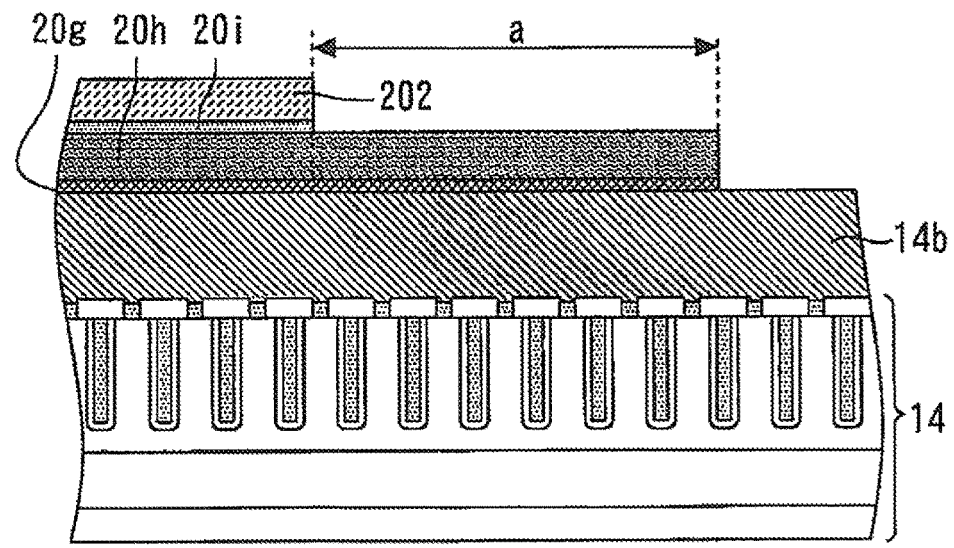
FIG. 17 is a cross-sectional view showing a state after removal of the antioxidation film on the peripheral portion of the metal film.

Next, the antioxidation film on the peripheral portion of the metal film is removed. FIG. 17 is a cross-sectional view showing a state after removal of the antioxidation film on the peripheral portion of the metal film. The antioxidation film is removed, for example, by a dry etching process such as sputter etching using Ar plasma or Ar ion beam milling.

Figure 18:
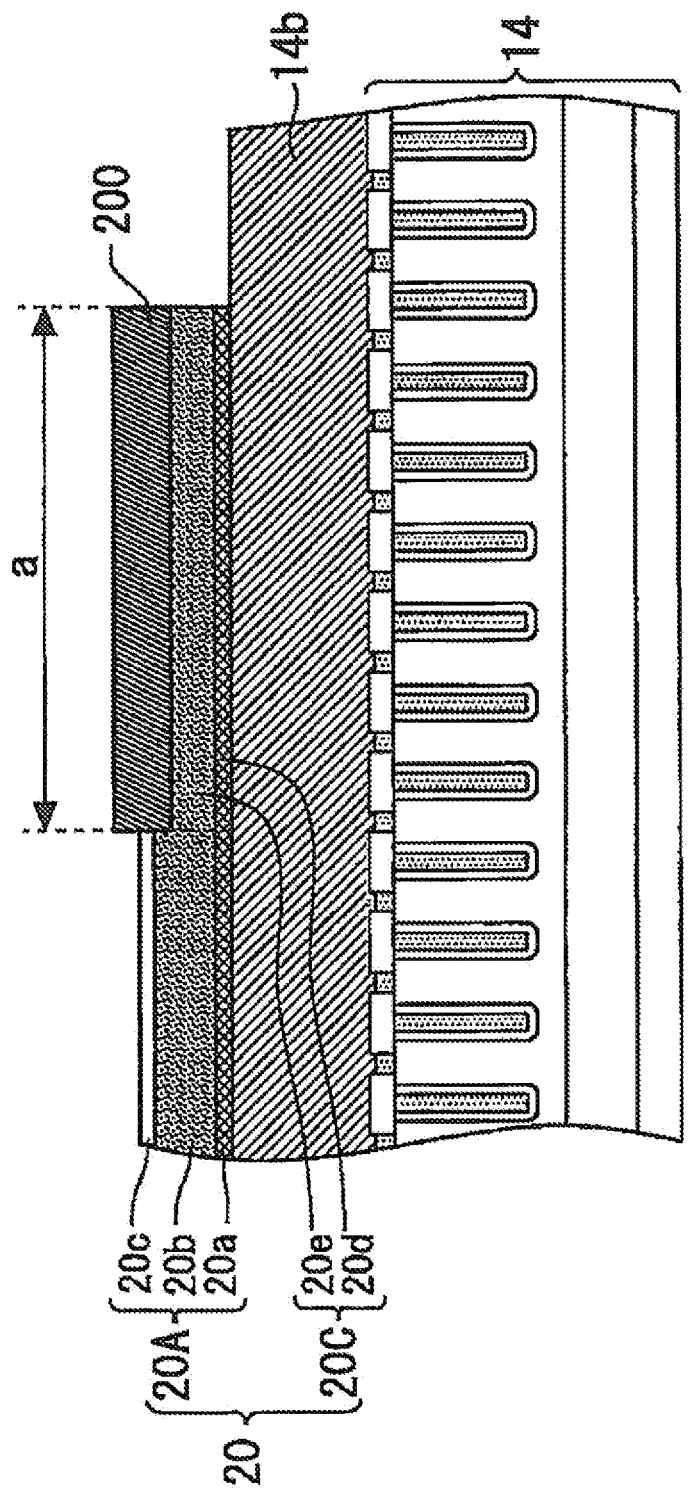
FIG. 18 is a cross-sectional view showing a state after forming the modified film.

Next, the sacrificial protective film 202 is removed and the modified film is formed on the surface of the peripheral portion of the metal film. FIG. 18 is a cross-sectional view showing a state after forming the modified film. The modified film 200 is a metal oxide film formed by oxidizing the joining film 20h by oxygen plasma ashing or the like. The modified film 200 can easily be formed by selectively oxidizing the joining film 20h. In a case where wet etching with an organic solvent or the like is used to remove the sacrificial protective film 202, the modified film 200 can be made by irradiating the joining film 20h with UV light after drying.

Next, a joining step is performed. Details of the joining step are the same as those in Embodiment 1. Thus, wet-spreading of the solder onto the peripheral portion in the joining step can be prevented by forming the modified film 200 less solderable than the central portion on the peripheral portion of the metal film before the joining step. The portion on which the modified film 200 is formed can therefore be formed as the stress relieving portion 20C.

In the semiconductor device manufacturing method according to Embodiment 2 of the present invention, the modified film 200 is used to prevent wet-spreading of the solder 30 and to enable the formation of the stress relieving portion 20C. The modified film 200 can easily be formed only by oxidizing the joining film 20h. The reason that the length (a) of the modified film 200 from the portion bordering on the joining portion 20A to the end is set to a value in the range from 100 to 1000 μm is as described below. The setting of the length (a) to the value equal to or larger than 100 μm enables securing a sufficient margin such that the solder does not wet-spread on the modified film 200 having low wettability Limiting the length (a) up to 1000 μm enables securing a solder-surface electrode joining portion of a sufficiently large area to maintain certain solder strength and large-current energization performance.

The modified film 200 is not limited to the metal oxide film obtained by oxidizing Ni and is not limited to a particular type as long as the film is capable of inhibiting wet-spreading of solder in the joining step. The step of removing the antioxidation film can be omitted if a process not including forming the antioxidation film on the stress relieving portion is adopted.

Wet-spreading of solder is prevented by using the coating film 22 in Embodiment 1 of the present invention and the modified film 200 in Embodiment 2 of the present invention. However, the stress relieving portion can be formed by forming solder only on the central portion of the metal film with some means other than the coating film 22 or the modified film 200. Accordingly, any means other than the coating film 22 or the modified film 200 may be used as long as the means is capable of preventing wet-spreading of solder.

DESCRIPTION OF SYMBOLS 10 semiconductor, 12 base plate, 14 semiconductor element, 14a gate electrode, 14b surface electrode, 14c collector electrode, 16,30 solder, 20 metal film, 20A joining portion, 20B,20C stress relieving portion, 20a first intimate-contact film, 20b first joining film, 20c alloy portion, 20d second intimate-contact film, 20e second joining film, 20f antioxidation film, 20g intimate-contact film, 20h joining film, 20i antioxidation film, 22 coating film, 32,42,52 external electrode, 50 wire, 60 insulating sheet, 70 encapsulation material, 100 resist, 200 modified film, 202 sacrificial protective film

The invention claimed is:

1. A semiconductor device comprising:
a semiconductor element;
a surface electrode formed on a surface of the semiconductor element;
a metal film formed on the surface electrode so as to have a joining portion and a stress relieving portion formed so as to border on and surround the joining portion;
solder joined to the joining portion while avoiding the stress relieving portion;
an external electrode joined to the joining portion through the solder; and
a layer formed of a material less solderable with the solder than a surface portion in the joining portion, the layer being provided on a surface of the stress relieving portion in a position to prevent the solder from wet-spreading into a region right above the stress relieving portion, wherein
the layer is thinner than the solder, and
the stress relieving portion is formed so that a length from a portion bordering on the joining portion to an outermost peripheral portion is equal to or larger than 10 μm.

2. The semiconductor device according to claim 1, wherein the layer is a coating film having a thickness in a range from 2 to 20 μm.

3. The semiconductor device according to claim 1, wherein a modified film is formed as the layer and the length of the modified film from the portion bordering on the joining portion to an end is in a range from 10 to 1000 μm.

4. The semiconductor device according to claim 1, wherein a modified film is formed as the layer and the modified film is formed of a metal oxide film.

5. The semiconductor device according to claim 1, wherein the surface electrode is formed of a material having an aluminum content of 95% or more.

6. A semiconductor device comprising:
a semiconductor element;
a surface electrode formed on a surface of the semiconductor element;
a metal film formed on the surface electrode so as to have a joining portion and a stress relieving portion formed so as to border on and surround the joining portion;
solder joined to the joining portion while avoiding the stress relieving portion;
an external electrode joined to the joining portion through the solder; and
a layer formed of a material less solderable with the solder than a surface portion in the joining portion, the layer being provided on a surface of the stress relieving portion in a position to prevent the solder from wet-spreading into a region right above the stress relieving portion, the layer is thinner than the solder, wherein
the joining portion includes a first intimate-contact film formed of Ti or Mo on the surface electrode, a first joining film formed of Ni on the first intimate-contact film, and an alloy portion formed of the solder and Ni on the first joining film,
the stress relieving portion includes a second intimate-contact film formed of Ti or Mo on the surface electrode, a second joining film formed of Ni on the second intimate-contact film, and an antioxidation film formed of Au or Ag on the second joining film,
the first joining film is formed thinner than the second joining film, and
the thickness of the first joining film is equal to or larger than 0.5 μm.

7. A semiconductor device manufacturing method comprising:
a step of forming a surface electrode on a semiconductor element;
a step of forming a metal film on the surface electrode;
a step of forming a layer on a peripheral portion of the metal film in a position to prevent a solder from wet-spreading into a region right above the peripheral portion of the metal film, the layer is a material less solderable with the solder than a surface portion of a central portion of the metal film; and
a joining step of forming the solder on the central portion of the metal film while avoiding a peripheral portion of the metal film, and joining the metal film to an external electrode through the solder, wherein
the layer is thinner than the solder, and
the layer is formed so that a length from a portion bordering on the central portion to an outermost peripheral portion is equal to or larger than 10 μm.

8. The semiconductor device manufacturing method according to claim 7, wherein the layer is a modified film and the modified film is formed of a metal oxide film.

9. A semiconductor device comprising:
a semiconductor element;
a surface electrode formed on a surface of the semiconductor element;
a metal film formed on the surface electrode so as to have a joining portion and a stress relieving portion formed so as to border on and surround the joining portion;
solder joined to the joining portion while avoiding the stress relieving portion; and
an external electrode joined to the joining portion through the solder, wherein
the joining portion includes a first intimate-contact film formed of Ti or Mo on the surface electrode, a first joining film formed of Ni on the first intimate-contact film, and an alloy portion formed of the solder and Ni on the first joining film, and
the stress relieving portion includes a second intimate-contact film formed of Ti or Mo on the surface electrode, a second joining film formed of Ni on the second intimate-contact film, and an antioxidation film formed of Au or Ag on the second joining film,
the first joining film is formed thinner than the second joining film, and
the thickness of the first joining film is equal to or larger than 0.5 µm.

10. A semiconductor device comprising:
a semiconductor element;
a surface electrode formed on a surface of the semiconductor element;
a metal film formed on the surface electrode so as to have a joining portion and a stress relieving portion formed so as to border on and surround the joining portion;
solder joined to the joining portion while avoiding the stress relieving portion;
an external electrode joined to the joining portion through the solder; and
a modified film formed of a material less solderable with the solder than a surface portion in the joining portion, the modified film being provided on a surface of the stress relieving portion in a position to prevent the solder from wet-spreading into a region right above the stress relieving portion,
wherein the modified film is formed so that a length from a portion bordering on the joining portion to an outermost peripheral portion is equal to or larger than 10 µm.

11. The semiconductor device according to claim 10, wherein the length of the modified film from the portion bordering on the joining portion to an end is in a range from 10 to 1000 µm.

12. The semiconductor device according to claim 10, wherein the modified film is formed of a metal oxide film.

13. A semiconductor device manufacturing method comprising:
a step of forming a surface electrode on a semiconductor element;
a step of forming a metal film on the surface electrode;
a joining step of forming solder on a central portion of the metal film while avoiding a peripheral portion of the metal film, and joining the metal film to an external electrode through the solder; and
a step of forming a modified film less solderable with the solder than the central portion on the peripheral portion before the joining step, wherein the modified film is positioned to prevent the solder from wet-spreading into a region right above the peripheral portion of the metal film,
wherein the modified film is formed so that a length from a portion bordering on the central portion to an outermost peripheral portion is equal to or larger than 10 µm.

* * * * *